(12) United States Patent
Katsuno et al.

(10) Patent No.: US 9,980,371 B2
(45) Date of Patent: May 22, 2018

(54) PRINTED WIRING BOARD

(71) Applicant: IBIDEN CO., LTD., Ogaki-shi (JP)

(72) Inventors: Takayuki Katsuno, Ogaki (JP); Yuki Ito, Ogaki (JP); Takeshi Furusawa, Ogaki (JP); Takema Adachi, Ogaki (JP)

(73) Assignee: IBIDEN CO., LTD., Ogaki-shi (JP)

(*) Notice: Subject to any disclaimer, the term of this patent is extended or adjusted under 35 U.S.C. 154(b) by 0 days. days.

(21) Appl. No.: 15/044,380

(22) Filed: Feb. 16, 2016

(65) Prior Publication Data

US 2016/0242285 A1  Aug. 18, 2016

(30) Foreign Application Priority Data

Feb. 16, 2015  (JP) .................................. 2015-027656

(51) Int. Cl.
| | |
|---|---|
| H05K 1/11 | (2006.01) |
| H05K 1/02 | (2006.01) |
| H05K 3/00 | (2006.01) |
| H05K 3/24 | (2006.01) |
| H05K 3/02 | (2006.01) |
| H05K 3/18 | (2006.01) |

(52) U.S. Cl.
CPC ........... *H05K 1/0271* (2013.01); *H05K 3/007* (2013.01); *H05K 3/244* (2013.01); *H05K 3/025* (2013.01); *H05K 3/188* (2013.01); H05K 2201/0338 (2013.01); H05K 2201/0344 (2013.01); H05K 2201/098 (2013.01); H05K 2203/1184 (2013.01)

(58) Field of Classification Search
CPC .......... H05K 1/11; H05K 1/111; H05K 1/115; H05K 1/117; H05K 2201/09427; H05K 2201/09472; H05K 2201/09736
See application file for complete search history.

(56) References Cited

U.S. PATENT DOCUMENTS

| | | | |
|---|---|---|---|
| 6,239,983 B1 * | 5/2001 | Shingai ............... | H01L 21/4853 174/255 |
| 6,573,598 B2 * | 6/2003 | Ohuchi .................. | H01L 21/78 257/734 |
| 7,397,000 B2 | 7/2008 | Shimoto et al. | |

(Continued)

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A printed wiring board includes a resin insulating layer having recess portions formed on first surface, a first conductor layer formed in the recess portions and including pads positioned to mount an electronic component, conductive pillars formed on the pads, respectively, and formed to mount the electronic component onto the resin insulating layer, a second conductor layer formed on second surface of the resin insulating layer on the opposite side with respect to the first surface, and a via conductor formed in the resin insulating layer such that the via conductor is penetrating through the resin insulating layer and connecting the first and second conductor layers. The pillars is formed such that each of the pads has an exposed surface exposed from a respective one of the conductive pillars, and the pads are formed such that the exposed surface is recessed from the first surface of the resin insulating layer.

20 Claims, 11 Drawing Sheets

(56) References Cited

U.S. PATENT DOCUMENTS

| | | | |
|---|---|---|---|
| 8,476,754 B2 * | 7/2013 | Kodani | H01L 23/49811 174/261 |
| 2007/0145584 A1 * | 6/2007 | Kataoka | C25D 5/02 257/736 |
| 2008/0149379 A1 * | 6/2008 | Nagase | H01L 23/5389 174/260 |
| 2011/0284269 A1 * | 11/2011 | Maeda | H05K 1/113 174/251 |
| 2014/0008814 A1 * | 1/2014 | Chen | H01L 23/481 257/774 |
| 2015/0282314 A1 * | 10/2015 | Furuta | H05K 3/4007 174/257 |
| 2015/0334834 A1 * | 11/2015 | Otomaru | H01L 23/49866 174/257 |
| 2016/0021758 A1 * | 1/2016 | Furutani | H05K 3/103 174/251 |
| 2017/0033036 A1 * | 2/2017 | Kajihara | H01L 23/49827 |

* cited by examiner

PRINTED WIRING BOARD

CROSS-REFERENCE TO RELATED APPLICATIONS

The present application is based upon and claims the benefit of priority to Japanese Patent Application No. 2015-027656, filed Feb. 16, 2015, the entire contents of which are incorporated herein by reference.

BACKGROUND OF THE INVENTION

Field of the Invention

The present invention relates to a printed wiring board that has a pad and has a conductive pillar that is formed on the pad.

Description of Background Art

U.S. Pat. No. 7,397,000 describes a circuit substrate and a semiconductor package. The circuit substrate of U.S. Pat. No. 7,397,000 has an insulating film, a lower-layer wiring that is formed on a lower surface of the insulating film, an upper-layer wiring that is formed on an upper surface of the insulating film, and a via hole that penetrates the insulating film and connects the upper-layer wiring and the lower-layer wiring. The entire contents of this publication are incorporated herein by reference.

SUMMARY OF THE INVENTION

According to one aspect of the present invention, a printed wiring board includes a resin insulating layer having recess portions formed on a first surface of the resin insulating layer, a first conductor layer formed in the recess portions and including pads positioned to mount an electronic component onto the resin insulating layer, conductive pillars formed on the pads, respectively, and formed to mount the electronic component onto the resin insulating layer, a second conductor layer formed on a second surface of the resin insulating layer on the opposite side with respect to the first surface, and a via conductor formed in the resin insulating layer such that the via conductor is penetrating through the resin insulating layer and is connecting the first conductor layer and the second conductor layer. The pillars is formed such that each of the pads has an exposed surface exposed from a respective one of the conductive pillars, and the pads are formed such that the exposed surface is recessed from the first surface of the resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
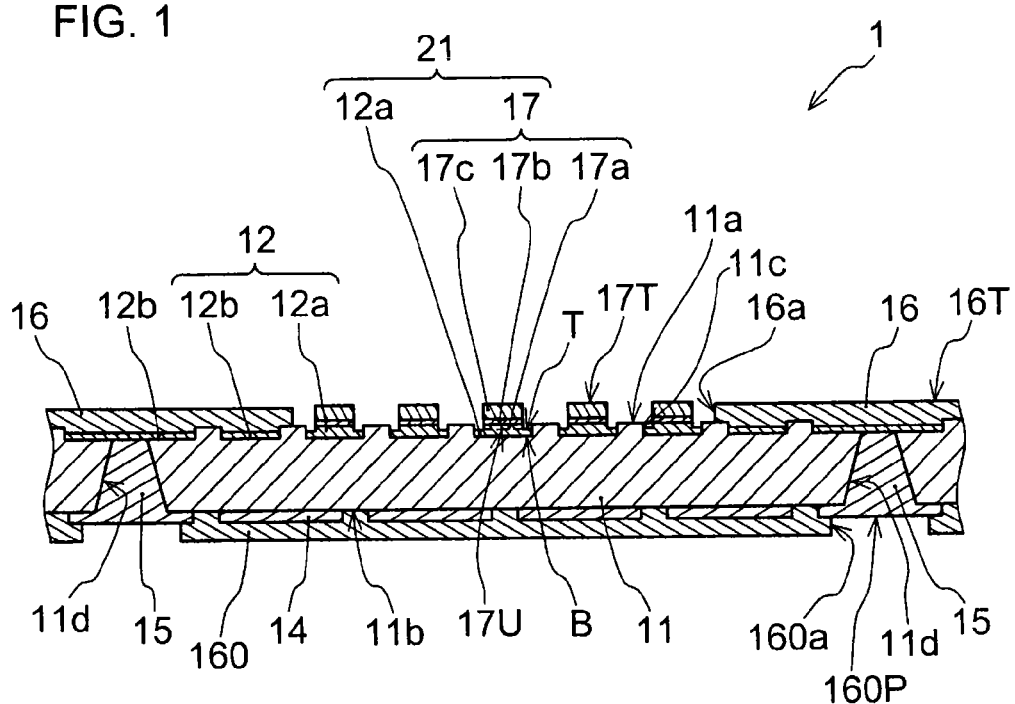
FIG. 1 is a cross-sectional view for describing a printed wiring board according to an embodiment of the present invention.

The embodiments will now be described with reference to the accompanying drawings, wherein like reference numerals designate corresponding or identical elements throughout the various drawings.

FIG. 1 is for describing a cross section of a printed wiring board 1 of the embodiment. The printed wiring board 1 is formed to include a resin insulating layer 11 that has a first surface (11a) and a second surface (11b) that is on an opposite side of the first surface (11a), a first conductor layer 12 that includes a pad (12a) that is formed on the first surface (11a) of the resin insulating layer 11, a second conductor layer 14 that is formed on the second surface (11b) of the resin insulating layer 11, a via conductor 15 that penetrates the resin insulating layer 11 and connects the first conductor layer 12 and the second conductor layer 14, and a conductive pillar 17 that is formed on the pad (12a) for mounting an electronic component. The conductive pillar 17 has an upper surface (17T), and the electronic component is mounted on the upper surface (17T). An electrode 21 for connecting to the electronic component is formed by the pad (12a) and the conductive pillar 17.

Examples of the electronic component include a semiconductor element, a passive element (such as a capacitor or a resistor), an interposer having a wiring layer, a semiconductor device having a rewiring layer, a WLP (Wafer Level Package), and the like.

As illustrated in FIG. 1, the resin insulating layer 11 has a recess (11c) for the first conductor layer 12 on the first surface (11a) side. The first conductor layer 12 is formed in the recess (11c). The first conductor layer 12 is embedded in the recess (11c). The first conductor layer 12 has a top surface (T) and a bottom surface (B) that is on an opposite side of the top surface (T). The top surface (T) faces toward the first surface (11a) of the resin insulating layer 11, and the bottom surface (B) faces toward a bottom of the recess (11c). The top surface (T) of the first conductor layer 12 is recessed from the first surface (11a). As illustrated in FIG. 1, the second conductor layer 14 is formed on the second surface (11b) of the resin insulating layer 11. The second conductor layer 14 projects from the second surface (11b) of the resin insulating layer 11.

Figure 5:
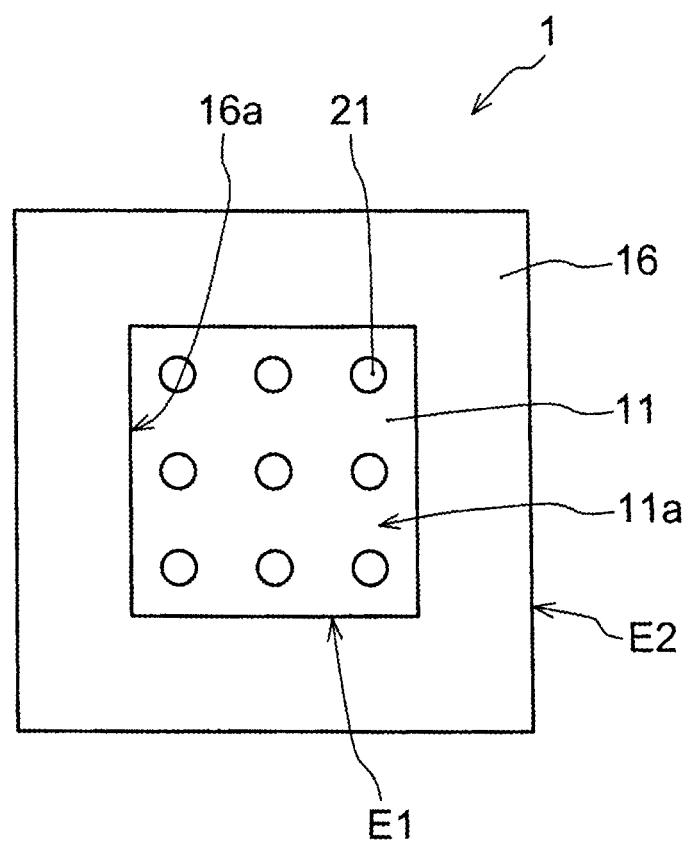
FIG. 5 illustrates a shape of an upper side solder resist layer.

As illustrated in FIG. 1, on the first surface (11a) of the resin insulating layer 11, the printed wiring board 1 has an upper side solder resist layer 16 that has an opening part (16a) for exposing electrodes 21. As illustrated in FIG. 5, the upper side solder resist layer 16 is formed in a shape of a frame and covers a wiring (12b) of the first conductor layer 12 that is formed in an outer peripheral portion of the printed wiring board 1 and covers the outer peripheral portion of the resin insulating layer 11. The electrodes 21 are formed substantially at a center of the printed wiring board 1, and all of the electrodes 21 are exposed by the one opening part (16a).

It is preferable that the upper surface (17T) of the conductive pillar 17 be positioned above an upper surface (16T) of the upper side solder resist layer. It facilitates mounting an electronic component on the conductive pillar 17. When the upper surface (17T) of the conductive pillar 17 is positioned below the upper surface of the upper side solder resist layer 16, a thickness of an applied example that includes the printed wiring board and an electronic component is reduced. In this case, the upper surface (17T) is positioned between the first surface (11a) of the resin insulating layer 11 and the upper surface (16T) of the upper side solder resist layer 16. The upper surface (16T) of the upper side solder resist layer 16 is a surface that is distant from the first surface (11a) of the resin insulating layer 11.

As illustrated in FIG. 1, on the second surface (11b) of the resin insulating layer 11 and on the second conductor layer 14, the printed wiring board 1 has a lower side solder resist layer 160 that has opening parts (160a). The lower side solder resist layer 160 is formed substantially on an entire surface of the printed wiring board 1. The opening parts (160a) respectively expose pads (160P) for connecting to a motherboard.

The printed wiring board 1 has the conductive pillar 17 on the first surface (11a) of the resin insulating layer 11, but does not have a conductive pillar on the second surface (11b). Therefore, a difference between a conductor amount on the first surface (11a) and a conductor amount on the second surface (11b) is likely to increase. Strength of the printed wiring board 1 on the first surface (11a) side and strength of the printed wiring board 1 on the second surface (11b) side are likely to be different. Warpage is likely to occur. In order to improve the situation of the warpage due to the conductive pillar 17, a shape of the upper side solder resist layer 16 and a shape of the lower side solder resist layer 160 are different. By forming the lower side solder resist layer 160 substantially on the entire surface of the printed wiring board 1, the printed wiring board 1 on the second surface (11b) side is reinforced. The warpage of the printed wiring board 1 is reduced. In FIG. 1, the upper side solder resist layer 16 is formed in the outer peripheral portion of the printed wiring board 1. However, it is also possible that the printed wiring board 1 has the lower side solder resist layer 160 but does not have the upper side solder resist layer 16.

Figure 4:
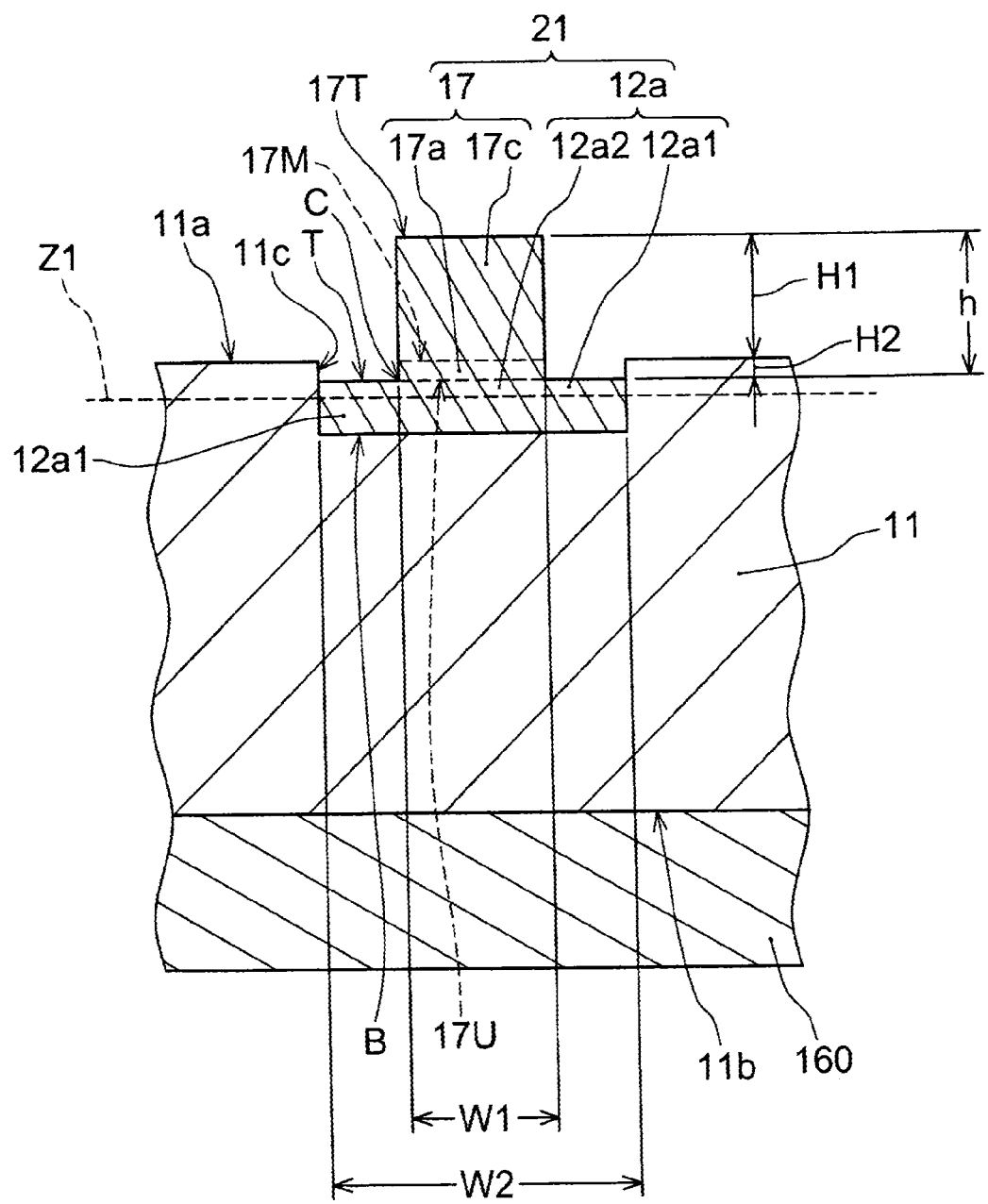
FIG. 4 illustrates another example of an electrode.

FIG. 4 illustrates an example of the electrode 21 that is formed by the pad (12a) and the conductive pillar 17 on the pad (12a). The pad (12a) has a back surface (B) that opposes a bottom surface of the recess (11c) and has the top surface (T) on an opposite side of the back surface (B). As illustrated in FIG. 4, the top surface (T) of the pad (12a) is recessed from the first surface (11a) of the resin insulating layer 11. There is a space between the first surface (11a) and the top surface (T).

The conductive pillar 17 has the upper surface (17T) and a lower surface (17U) that is on an opposite side of the upper surface (17T). The lower surface (17U) is depicted using a dotted line in FIG. 4. An electronic component is mounted on the upper surface (17T) of the conductive pillar 17. The conductive pillar 17 is connected via the lower surface (17U) to the pad (12a). The conductive pillar 17 of FIG. 4 is formed by a conductor layer (17a) and a metal film (17c) on the conductor layer (17a). The conductive pillar 17 has a length (h). A distance between the upper surface (17T) and the lower surface (17U) and the length (h) are equal. In the example of FIG. 4, the length (h) of the conductive pillar 17 is a sum of a thickness of the metal film (17c) and a thickness of the conductor layer (17a). The length (h) is 15 μm or more and 35 μm or less. Since the length (h) has a predetermined range, mounting yield of an electronic component is high. Further, a stress due to a difference in thermal expansion coefficient between the electronic component and the printed wiring board 1 is relaxed by the conductive pillar 17. Even when the applied example is subjected to heat cycles, connection reliability between the electronic component and the printed wiring board is stable for a long period of time. There is a boundary (17M) between the conductor layer (17a) and the metal film (17c). The boundary (17M) is depicted using a dashed line in FIG. 4. The lower surface (17U) is positioned on the same plane as the top surface (T) of the pad (12a). The boundary (17M) is positioned on the same plane as the first surface (11a).

In the example of FIG. 4, the pad (12a), the conductor layer (17a) and the metal film (17c) are integrally formed. The pad (12a) and the conductor layer (17a) are continuously formed. The metal film (17c) and the conductor layer (17a) are continuously formed. For example, these are formed by the same plating film. Electrolytic copper plating is preferred. Therefore, although the conductive pillar 17 of FIG. 4 has the boundary (17M) and the lower surface (17U), an interface does not exist between the pad (12a) and the conductor layer (17a). An interface does not exist between the metal film (17c) and the conductor layer (17a). The lower surface (17U) and the boundary (17M) are virtual interfaces. A side wall of the conductive pillar 17 and the top surface (T) of the pad (12a) intersect at a corner (C) illustrated in FIG. 4. When the conductive pillar 17 is subjected to a stress, the stress is likely to concentrate on the corner (C). However, in the electrode 21 of FIG. 4, the pad (12a) and the conductive pillar 17 are integrally formed. Therefore, a crack is unlikely to occur in the electrode 21 from the corner (C). Even when the stress concentrates on the corner (C), the electrode 21 is unlikely to deteriorate. The conductive pillar 17 for mounting an electronic component is formed on the pad (12a), and projects from the first surface (11a) of the resin insulating layer 11. Even when the top surface (T) of the pad (12a) is recessed from the first surface (11a), since the printed wiring board 1 has the conductive pillar 17 that projects from the first surface (11a), an electronic component can be reliably mounted on the printed wiring board 1. A height (H1) of the projection is illustrated in FIG. 4. The height (H1) is 18 μm or more and 30 μm or less. The electronic component can be reliably mounted on the conductive pillar 17. An underfill can be filled in between the electronic component and the printed wiring board 1. By mounting the electronic component on the printed wiring board 1, an applied example formed by the printed wiring board 1 and the electronic component is obtained. Since the applied example has the conductive pillar 17, an underfill can be reliably filled in between the printed wiring board 1 and the electronic component.

The pad (12a) and the conductive pillar 17 of FIG. 4 each have a shape of circular cylinder. In FIG. 4, the conductive pillar 17 and the pad (12a) are cut by a plane that passes through a center of the upper surface (17T) and is perpendicular to the upper surface (17T). Further, a straight line, which passes through the center of the upper surface (17T) and is perpendicular to the upper surface (17T), passes through a center of the top surface (T) of the pad (12a).

As illustrated in FIG. 4, the conductive pillar 17 is formed substantially at the center of the pad (12a). A diameter (W1) of the conductive pillar is smaller than a diameter (W2) of the pad (12a). Therefore, the top surface (T) of an outer peripheral portion (12a1) of the pad (12a) is exposed. As illustrated in FIG. 4, the pad (12a) is formed by a central portion (12a2) that is formed below the conductive pillar 17 and the outer peripheral portion (12a1) that is exposed from the conductive pillar 17. The diameter (W1) of the conductive pillar 17 is a diameter of the upper surface (17T) of the conductive pillar 17. Or, among distances between any two points on an outer periphery of the upper surface (17T), a maximum distance corresponds to the diameter (W1). The diameter (W2) of the pad (12a) is a diameter of the top surface (T) of the pad. Or, among distances between any two points on an outer periphery of the top surface (T), a maximum distance corresponds to the diameter (W2). Or, among distances between any two points on an outer periphery of the recess (11c), a maximum distance corresponds to the diameter (W2). The outer periphery of the recess (11c) is described in the following. The recess (11c) is cut by a plane (Z1) that passes through a middle position between the first surface (11a) and the bottom surface and is parallel to the first surface (11a). A distance between the plane (Z1) and the first surface (11a) and a distance between the plane (Z1) and the bottom surface of the recess (11c) are equal. The outer periphery of the recess (11c) is obtained by linking points of intersection between the plane (Z1) and a side wall of the recess (11c). The side wall of the recess (11c) and a side wall of the resin insulating layer that forms the recess (11c) are substantially the same.

In the example of FIG. 4, the diameter (W1) is the diameter of the upper surface (17T) of the conductive pillar 17, and the diameter (W2) is the diameter of the top surface (T) of the pad (12a). The diameter (W1) is 15 µm or more and 75 µm or less. The diameter (W2) is 30 µm or more and 100 µm or less. A ratio (diameter (W2)/diameter (W1)) between the diameter (W2) and the diameter (W1) is 1.5 or more and 2.5 or less. Since the ratio (diameter (W2)/diameter (W1)) has a predetermined value, a stress is relaxed by the conductive pillar 17. Further, the conductive pillar 17 is unlikely to be deteriorated by heat cycles. In FIG. 4, the diameter (W1) is 20 µm, and the diameter (W2) is 35 µm.

As illustrated in FIG. 4, the top surface (T) is recessed from the first surface (11a), and a distance (H2) between the first surface (11a) and the top surface (T) is 5 µm or less. The lower surface (17U) is also recessed from the first surface (11a), and a distance (H2) between the first surface (11a) and the lower surface (17U) is 5 µm or less. The top surface (T) and the lower surface (17U) are positioned on the same plane. A value of the distance (H2) and the thickness of the conductor layer (17a) are substantially equal. The top surface (T) and the lower surface (17U) are recessed from the first surface (11a). Therefore, a stress is unlikely to directly act on the corner (C) formed by the conductive pillar 17 and the pad (12a) (see FIG. 4). Reliability is increased.

Figure 2A:
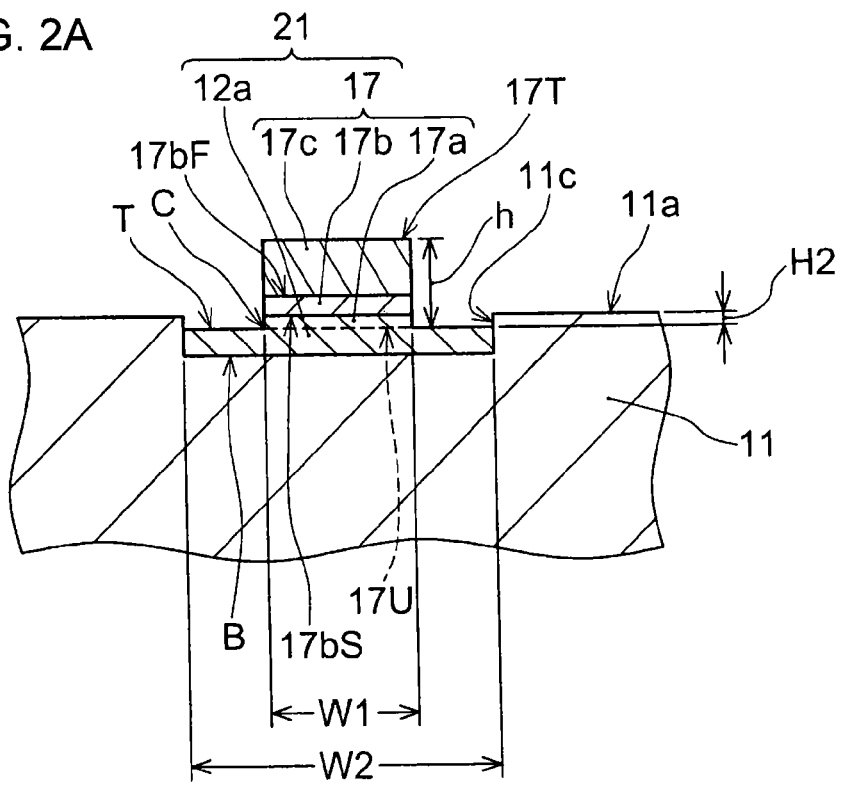
FIG. 2A illustrates an example of an electrode.

FIG. 2A illustrates another example of the electrode 21. The electrode of FIG. 2A has a point similar to the electrode of FIG. 4. For example, the conductive pillar 17 of FIG. 2A has a length (h). The length (h) of the conductive pillar 17 of FIG. 2A and the length (h) of the conductive pillar 17 of FIG. 4 are the same. The conductive pillar 17 of FIG. 2A has a diameter (W1). The diameter (W1) of the conductive pillar 17 of FIG. 2A and the diameter (W1) of the conductive pillar 17 of FIG. 4 are the same. The pad (12a) of FIG. 2A has a diameter (W2). The diameter (W2) of the pad of FIG. 2A and the diameter (W2) of the pad of FIG. 4 are the same. The conductive pillar 17 of FIG. 2A has a lower surface (17U) between the pad (12a) and the conductive pillar 17. The lower surface (17U) is indicated using a dotted line in FIG. 2A. In the example of FIG. 2A, the lower surface (17U) and the top surface (T) are positioned on the same plane.

The top surface (T) of the pad (12a) of FIG. 2A is recessed from the first surface (11a), and a distance (H2) between the first surface (11a) and the top surface (T) is 5 µm or less. The lower surface (17U) of FIG. 2A is also recessed from the first surface (11a), and a distance (H2) between the first surface (11a) and the lower surface (17U) is 5 µm or less. The conductive pillar 17 of FIG. 2A has a metal layer (17b) that is formed on the pad (12a) and a metal film (17c) that is formed on the metal layer (17b). For example, the metal layer (17b) is formed from a metal foil 13 (see FIG. 3B). Examples of the metal foil 13 include a copper foil and a nickel foil. The metal film (17c) is formed by electrolytic plating. An example of the metal film (17c) is an electrolytic copper plating film. The conductive pillar 17 of FIG. 2A may further have a conductor layer (17a) positioned below the metal layer (17b). The conductor layer (17a) is formed between the metal layer (17b) and the pad (12a). The conductor layer (17a) is integrally formed with the pad (12a). The conductor layer (17a) and the pad (12a) are separated by the lower surface (17U). However, the pad (12a) and the conductor layer (17a) are integrally formed. A side wall of the conductive pillar 17 and the top surface (T) of the pad (12a) intersect at a corner (C) illustrated in FIG. 2A. When the conductive pillar 17 is subjected to a stress, the stress is likely to concentrate on the corner (C). However, in the electrode 21 of FIG. 2A, the pad (12a) and the conductor layer (17a) are integrally formed. Therefore, a crack is unlikely to occur in the electrode from the corner (C). Even when the stress concentrates on the corner (C), the electrode 21 is unlikely to deteriorate.

In the examples of FIGS. 2A and 4, an angle between the side wall of the conductive pillar 17 and the top surface (T) of the pad (12a) is 90 degrees. Further, from the upper surface (17T) of the conductive pillar 17 to the lower surface (17U), the conductive pillar 17 has a constant diameter. A diameter of the lower surface (17U) and a diameter of the upper surface (17T) are substantially equal.

Figure 2B:
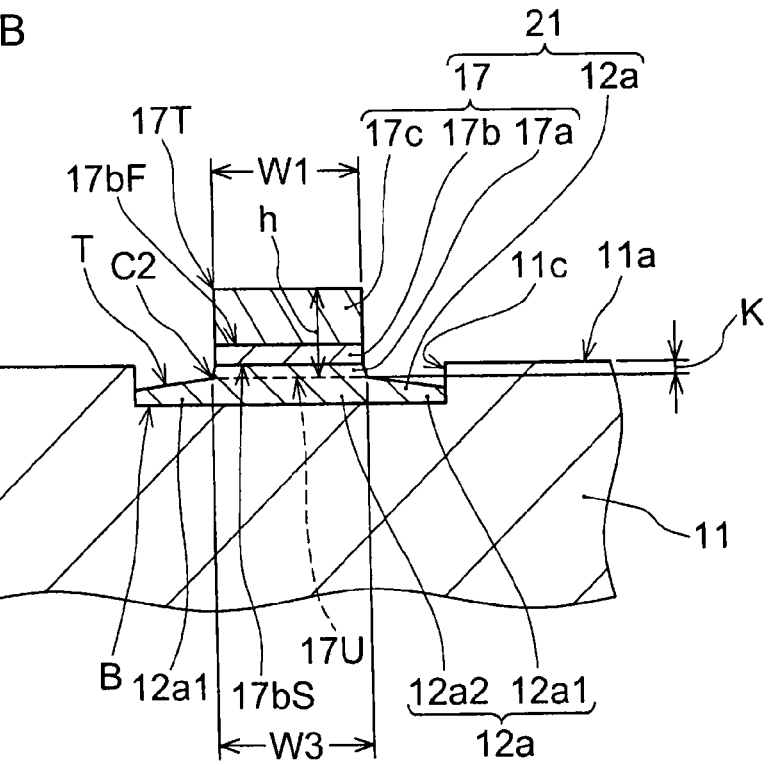
FIG. 2B illustrates another example of an electrode.
Figure 2C:
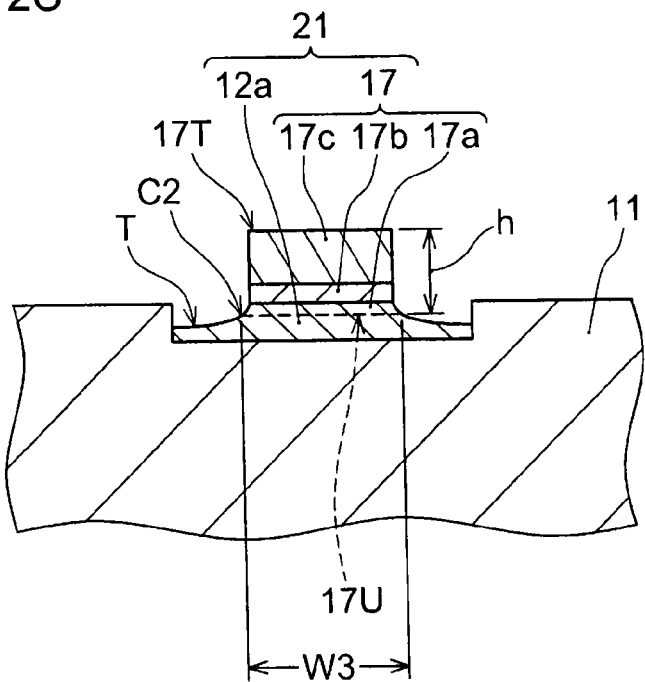
FIG. 2C illustrates another example of an electrode.

FIGS. 2B and 2C illustrate other examples of electrodes. Similar to the example of FIG. 2A, conductive pillars 17 of FIGS. 2B and 2C each have a metal layer (17b) that is formed from a metal foil 13 that is formed on the pad (12a), and a metal film (17c) that is formed on the metal layer (17b). The conductive pillars 17 of FIGS. 2B and 2C may each further have a conductor layer (17a) positioned below the metal layer (17b). The conductor layer (17a) is formed between the metal layer (17b) and the pad (12a). The conductor layer (17a) is formed between the metal layer (17b) and a lower surface (17U). The lower surface (17U) is depicted using a dotted line in FIGS. 2B and 2C. The conductor layer (17a) and the pad (12a) are separated by the lower surface (17U). However, the conductor layer (17a) is integrally formed with the pad (12a). A side wall of each of the conductive pillars 17 and a top surface (T) of the pad (12a) intersect at a corner (C2) in FIGS. 2B and 2C. The corner (C2) and an intersection point (C2) indicate the same position. When each of the conductive pillars 17 is subjected to a stress, the stress is likely to concentrate on the corner (C). However, in each of the electrodes 21 of FIGS. 2B and 2C, the pad (12a) and the conductor layer (17a) are integrally formed. Therefore, a crack is unlikely to occur in each of the electrodes 21 from the corner (C2). Even when the stress concentrates on the corner (C2), each of the electrodes 21 is unlikely to deteriorate.

In the examples of FIGS. 2A and 4, the diameter (W1) of each of the conductive pillars 17 is substantially constant. In contrast, in the examples of FIGS. 2B and 2C, the diameter of each of the conductive pillars 17 is not constant. As illustrated in FIGS. 2B and 2C, the conductor layer (17a) increases in diameter from an interface between the metal layer (17b) and the conductor layer (17a) toward the lower surface (17U). Even when a stress concentrates on the intersection point (C2) between the side wall of each of the conductive pillars 17 and the top surface (T) of the pad (12a), since a diameter (W3) of the lower surface (17U) is large, a problem such as a crack is unlikely to occur in each of the electrodes 21 from the intersection point (C2). According to the present embodiment, a large electronic component can be mounted on the printed wiring board 1. The large electronic component has a side of 20 mm or more. When a size of the electronic component becomes large, a magnitude of a stress increases. To withstand the stress, it is preferable that strength of the conductive pillar 17 be high. However, when the number of heat cycles increases, it is possible that a connecting part (such as a solder bump) between the conductive pillar 17 and the electronic component deteriorates. For example, due to heat cycles, connection resistance between the electronic component and the printed wiring board increases. This is because the conductive pillar 17 has a high rigidity and a stress is likely to concentrate on the connecting part.

In order to prevent such a problem, in the examples of FIGS. 2B and 2C, the diameter (W3) of the lower surface (17U) is larger than the diameter (W1) of the upper surface. However, when a value of a ratio (diameter (W3)/diameter (W1)) becomes large, a difference in strength between a portion near an upper end of the conductive pillar 17 and a portion near a lower end of the of the conductive pillar 17 becomes large. Since the strength of the portion near the lower end is high, it is difficult for the portion near the lower end to deform. When the value of the ratio (diameter (W3)/diameter (W1)) exceeds 1.2, the effect of stress relaxation due to deformation is reduced. When the diameter (W3) exceeds 1.2 times of the diameter (W1), for example, due to heat cycles, a stress concentrates on a specific conductive pillar 17, and the specific conductive pillar 17 deteriorates. Therefore, in the present embodiment, the diameter (W3) is 1.2 times or less of the diameter (W1). A conductor positioned below the lower surface (17U) is too thick. When the conductor is too thick, even when the conductor is subjected to a stress, deformation of the conductor is small. Therefore, the conductor positioned below the lower surface (17U) does not have the function of the conductive pillar 17. Or, a percentage that the conductor contributes to the effect is small. According to the conductive pillar 17 of the present embodiment, a stress is relaxed by a thin portion, and the strength of the conductive pillar 17 is ensured by a thick portion.

For example, when the diameter (W3) of the lower surface (17U) is 1.2 times of the diameter (W1) of the upper surface (17T), a position of the lower surface (17U) is determined such that a value of the diameter (W3) and a value of 1.2 times of the diameter (W1) are the same value. When the diameter (W3) is 1.2 times of the diameter (W1), connection reliability between the conductive pillar 17 and the pad (12a) is high. Durability and stress relaxation are improved. The position of the lower surface (17U) is determined from the point of view of connection reliability, durability, stress relaxation, and the like. In the example of FIG. 2B, a distance (K) between the lower surface (17U) and the first surface (11a) is 1 μm or more and 4 μm or less. When the distance (K) is in this range, a force is unlikely to directly act on the lower surface (17U). The connection reliability between the conductive pillar 17 and the pad (12a) is high. As illustrated in FIGS. 2B and 2C, the top surface (T) of the pad (12a) and the lower surface (17U) intersect at the intersection point (C2).

A solder bump is formed on a front end portion of the conductive pillar 17, and the electronic component is mounted on the front end of the conductive pillar 17 via the solder bump. Solder may wetly spread to the side wall of the conductive pillar 17. However, in the examples of FIGS. 2B and 2C, since the front end portion of the conductive pillar 17 is thin, short-circuiting is unlikely to occur between adjacent conductive pillars 17 by the solder. In the examples of FIGS. 2A and 4, the first surface (11a) and the top surface (T) are substantially parallel to each other. In contrast, in the examples of FIGS. 2B and 2C, the top surface (T) of the pad (12a) that is exposed from the conductive pillar 17 is inclined with respect to the first surface (11a). It is preferable that an angle between the side wall of the conductive pillar 17 and the top surface (T) of the pad (12a) be greater than 90 degrees. A thickness of the outer peripheral portion (12a1) (distance between the bottom surface (B) and the top surface (T)) increases from a side wall of the pad (12a) toward the central portion (12a2). Since the side wall of the conductive pillar 17 and the top surface of the pad (12a) do not intersect at 90 degrees, a stress acting on the intersection point (C2) is dispersed. The reliability of the electrode 21 is increased.

When a volume of the electrode of FIG. 2A and a volume of the electrode of FIG. 2B are compared, the volume of the electrode of FIG. 2B is smaller than the volume of the electrode of FIG. 2A. Therefore, even when the conductive pillar 17 is formed only on the first surface (11a) of the resin insulating layer 11, a difference between a volume of a conductor formed on the first surface (11a) of the resin insulating layer 11 and a volume of a conductor formed on the second surface (11b) of the resin insulating layer 11 is reduced. The warpage of the printed wiring board 1 is reduced. A stress acting on the conductive pillar due to heat cycles is reduced. The connection reliability of the conductive pillar 17 is high. The top surface (T) of the pad (12a) of FIG. 2C is inclined with respect to the first surface (11a). The top surface (T) of the pad (12a) of FIG. 2C is curved. The electrode 21 of FIG. 2C has the same effect as the electrode 21 of FIG. 2B.

The conductive pillar 17, the pad (12a) and the electrode 21 of each of the examples of FIGS. 2A, 2B and 2C have the same height (h), height (H1), distance (H2) and ratio (diameter (W2)/diameter (W1)) as FIG. 4.

The metal layer (17b) that forms the conductive pillar 17 of FIGS. 2A, 2B and 2C is formed from the metal foil 13. Examples of the metal foil 13 include a copper foil and a nickel foil. The metal film (17c) and the conductor layer (17a) are formed, for example, by electrolytic plating. An example of the metal film (17c) and the conductor layer (17a) is an electrolytic copper plating film. The conductor layer (17a) and the pad (12a) are formed, for example, by electrolytic plating. A conductor that forms the conductor layer (17a) and a conductor that forms the pad (12a) are simultaneously formed. In order for a stress to be relaxed by the conductive pillar 17, the conductive pillar 17 has a predetermined height. The conductive pillar 17 having a predetermined height can be formed by the metal film (17c) that is formed of a plating film and the conductor layer (17a) that is formed of a plating film. An example of such a conductive pillar 17 is the conductive pillar 17 of FIG. 4. In the example of FIG. 4, a process is simplified. However, due to positions or the like in a plating tank, thicknesses of plating films are different. Therefore, when all conductive pillars 17 are formed by plating, variation in heights of the conductive pillars 17 increases. In order to reduce the variation, it is preferable that the conductive pillar 17 have the metal layer (17b) that is formed from the metal foil 13. By having the metal layer (17b), a thickness of a film that s formed in plating in the conductive pillar 17 can be reduced. When variation exists in the heights of the conductive pillars 17, variation exists in distances between electrodes of the electronic component such as a semiconductor element and the upper surfaces (17T) of the conductive pillars 17. When the variation is large, among the conductive pillars 17, some conductive pillars 17 are not connected to electrodes of the electronic component. Or, some conductive pillars 17 are incompletely connected to electrodes of the electronic component. Connection reliability is impaired. When the metal layer (17b) is provided, the heights of the conductive pillars 17 are controlled in a predetermined range. For example, a difference between a height of a highest conductive pillar 17 and a height of lowest conductive pillar is 10 µm or less. Since the metal foil has a uniform thickness, the thickness of the metal layer (17b) that is formed from the metal foil 13 becomes uniform. Therefore, even when the conductive pillar 17 having the metal layer (17b) has the metal film (17c) that is formed by plating, the influence due to the variation of plating is small. The variation in the heights of the conductive pillars 17 having the metal layer (17b) that is formed from the metal foil 13 is small.

As illustrated in FIG. 2A, the metal layer (17b) that forms the conductive pillar 17 of each of FIGS. 2A, 2B and 2C has a first surface (17bF) and a second surface (17bS) that is on an opposite side of the first surface. In FIGS. 2B and 2C, the reference numeral symbols 17bF and 17bS are not drawn. The first surface (17bF) opposes the metal film (17c), and the second surface (17bS) opposes the conductor layer (17a). The second surface (17bS) of the metal layer (17b) and the first surface (11a) of the resin insulating layer 11 are positioned on the same plane. As illustrated in FIG. 2A, the first surface (17bF) of the metal layer (17b) is positioned above the first surface (11a). In this way, a common plane is formed by the second surface (17bS) of the metal layer (17b) and the first surface (11a) of the resin insulating layer 11. The metal layer (17b) is formed from the metal foil 13. Therefore, heights of the first surfaces (17bF) of the metal layers (17b) of the conductive pillars 17 are substantially equal. Even when the metal films (17c) of the conductive pillars 17 are formed by plating, the metal films (17c) are formed on substantially the same height. Therefore, when the conductive pillars 17 each have the metal layer (17b), variation in the heights of the conductive pillars 17 is reduced.

The thickness of the metal layer (17b) (distance between the first surface (17bF) and the second surface (17bS) is 2 µm or more and 7 µm or less. The metal layer (17b) is formed by etching the metal foil 13. However, the details will be described later. The thickness of the metal layer (17b) and the thickness of the metal foil 13 are substantially the same. The thickness of the metal foil 13 is more uniform than a thickness of a metal film formed by plating. Therefore, when the thickness of the metal layer (17b) is 2 µm or more, variation in the heights (h) of the conductive pillars 17 is reduced. When the metal layer (17b) is too thin, in order to form the conductive pillar 17 having the predetermined height (h), the thickness of the metal film (17c) that forms the conductive pillar 17 is increased. When the metal film (17c) is formed from a plating film, depending on the thickness of the metal film (17c), variation in the thickness of the plating film increases. A difference in the height (h) between the conductive pillars 17 increases. When the difference in the height (h) is large, the yield in mounting an electronic component on the printed wiring board decreases. Since a stress concentrates on a specific conductive pillar 17, connection reliability between the electronic component and the printed wiring board decreases. When the thickness of the metal layer (17b) is in the above-described range, the variation in the heights (h) of the conductive pillars 17 is small, and the conductive pillars 17 having high connection reliability can be provided.

The height (h) of the conductive pillar 17 of each of FIGS. 2A, 2B and 2C is a sum of the thickness of the metal film (17c), the thickness of the metal layer (17b) and the thickness of the conductor layer (17a). When the metal layer (17b) is too thick, it takes time to remove an unwanted portion of the metal foil 13 by etching. Production efficiency decreases. Further, when the unwanted portion of the metal foil is removed by etching, the upper surface and the side wall of the metal film (17c) are also dissolved by an etching solution. To uniformly dissolve the upper surface and the side wall of the metal film (17c) is difficult. Therefore, when the etching time is long, variation in the heights and diameters of the conductive pillars 17 is likely to increase. From such a point of view, it is preferable that the thickness of the metal layer (17b) be 7 µm or less.

Figure 6A:
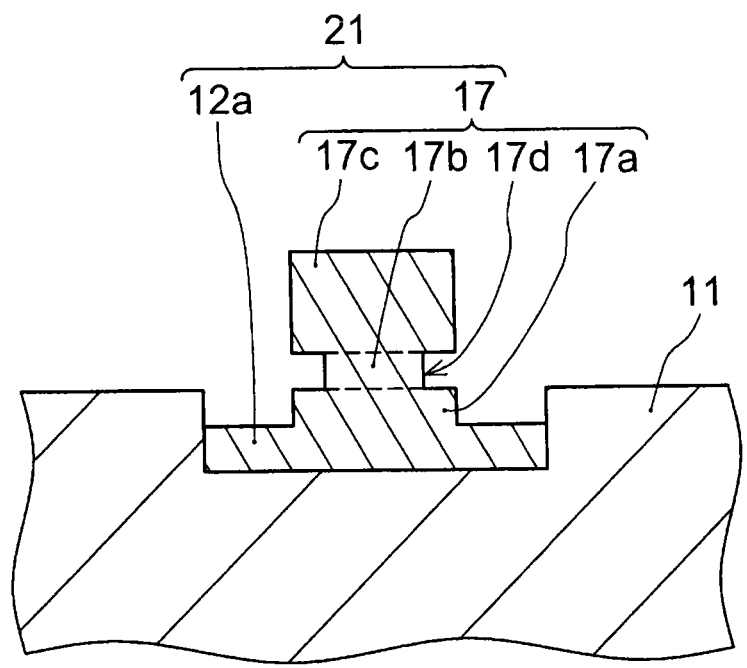
FIG. 6A illustrates an example of a conductive pillar.
Figure 6B:
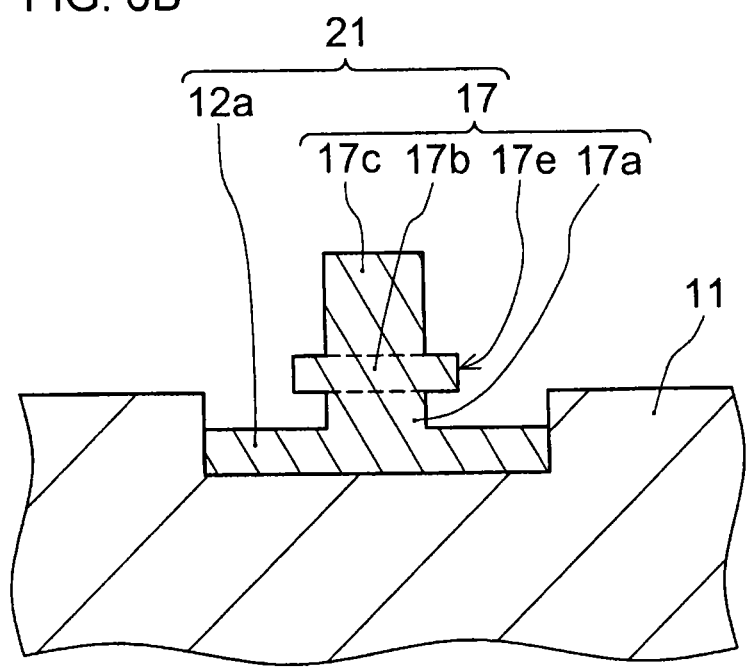
FIG. 6B illustrates another example of a conductive pillar.

When an etching speed of the metal layer (17b) is faster than an etching speed of the metal film (17c), as illustrated in FIG. 6A, the conductive pillar 17 has a recessed portion (17d). In FIG. 6A, a side surface of the metal layer (17b) is recessed from a side surface of the metal film (17c). The side surface of the metal layer (17b) is recessed from the side surface of the conductor layer (17a). When the etching speed of the metal film (17c) is faster than the etching speed of the metal layer (17b), as illustrated in FIG. 6B, the conductive pillar 17 has a projecting portion (17e). In FIG. 6B, the side wall of the metal layer (17b) bulges out from the side wall of the metal film (17c). The side wall of the metal layer (17b) bulges out from the side wall of the conductor layer (17a). When the conductive pillar 17 has the recessed portion (17d) or the projecting portion (17e), the effect of stress relaxation due to the conductive pillar 17 is increased. However, when a size of the recessed portion (17d) or the projecting portion (17e) is too large, a crack is likely to occur in the conductive pillar 17 from the recessed portion (17d) or the projecting portion (17e). When the thickness of the metal layer (17b) is in the above-described range, the size of the recessed portion (17d) or the projecting portion (17e) can be appropriately controlled.

The thickness of the metal film (17c) is 13 µm or more and 25 µm or less. Even when the metal film (17c) is formed by plating, variation in the thickness of the metal film (17c) is small. A stress can be relaxed by the conductive pillar 17. The metal film (17c) is formed by electroless plating or by electrolytic plating.

In the examples of FIGS. 2A, 2B, 2C and 4, the conductor layer (17a) is a part of the pad (12a). The conductive pillar 17 has a part of the pad (12a) (projecting portion of pad (12a)). The conductive pillar 17 and the pad (12a) share the projecting portion of the pad (12a). Therefore, a boundary portion of the conductive pillar 17 and the pad (12a) is formed by the conductor layer 12 that forms pad (12a). That is, the boundary portion of the pad (12a) and the conductive pillar 17 is formed by a material of the first conductor layer 12. When a lateral force is applied to the front end portion of the conductive pillar 17, the conductive pillar 17 tends to bend. A force is likely to concentrate on an interface between the conductive pillar 17 and the pad (12a). However, in the present embodiment, the conductive pillar 17 and the pad (12a) are integrally formed of the same material. Even when the conductive pillar 17 is subjected to a stress, peeling is unlikely to occur between the conductive pillar 17 and the pad (12a). Further, a crack is unlikely to occur in the conductive pillar 17 from the boundary of the conductive pillar 17 and the pad (12a).

Similar to the pad (12a) of FIG. 4, the pad (12a) illustrated in each of FIGS. 2A, 2B and 2C has the top surface (T). The top surface (T) is recessed from the first surface (11a) of the resin insulating layer 11. Further, an interface (virtual bonding interface) between the conductive pillar 17 and the pad (12a) is also recessed from the first surface (11a). The virtual bonding interface is positioned in the recess (11c) for forming the first conductor layer 12. A force is unlikely to directly act on the virtual bonding interface. The connection reliability between the conductive pillar 17 and the pad (12a) is increased. Therefore, a distance (H2) between the first surface (11a) and the virtual bonding interface is larger than 0. Further, it is preferable that the distance (H2) between the first surface (11a) and the virtual bonding interface be 4 μm or less. When the distance (112) exceeds 4 μm, a distance between the virtual bonding interface and the bottom surface (B) is too short. When the conductive pillar 17 is subjected to a stress, the pad (12a) is likely to be peeled off from the resin insulating layer 11. The virtual bonding interface and the lower surface (17U) are at the same position.

The metal layer (17b) and the metal film (17c) that form the conductive pillar 17 project from the first surface (11a) of the resin insulating layer 11. Further, the conductor layer (17a) is formed in the recess (11c) for the first conductor layer 12. Therefore, the conductive pillar 17 is in a space and is not in contact with the resin insulating layer 11. Therefore, when the conductive pillar 17 is subjected to a stress, the conductive pillar 17 can relatively freely deform. The conductive pillar 17 can absorb the stress by deforming.

In the examples of FIGS. 2A and 4, the angle between the side wall of the conductive pillar 17 and the top surface (T) of the pad (12a) is 90 degrees. The side wall of the conductive pillar 17 is perpendicular to the first surface (11a), and the top surface (T) of the pad (12a) is parallel to the first surface (11a). Such a shape is obtained, for example, using a mechanical method such as dry etching. The height (h) of each of the conductive pillars 17 illustrated FIGS. 2A and 4 is a distance between the top surface (T) of the pad (12a) and the upper surface (17T) of the conductive pillar 17. The thickness of the conductor layer (17a) of the conductive pillar 17 is greater than 0 and 5 μm or less. When the thickness of the conductor layer (17a) is 1 μm or more and 4 μm or less, bonding strength between the electrode 21 and the resin insulating layer 11 is high. Variation in the distance (height) (h) between the upper surface (17T) and the lower surface (17U) is small. Connection reliability of the applied example is high. Mounting yield of the electronic component is high.

In the example of FIG. 2B, the top surface (T) of the pad (12a) is inclined with respect to the first surface (11a) of the resin insulating layer 11. The top surface (T) of the pad (12a) is inclined such that the thickness of the pad (12a) increases from the side wall of the pad (12a) toward the conductive pillar 17. An exposed surface of the conductor layer (17a) is inclined such that the thickness of the conductor layer (17a) increases from an outer periphery of the lower surface (17U) of the conductive pillar 17 toward a center of the lower surface (17U). The conductive pillar 17 is used as a mask, and the top surface (T) of the pad (12a) and the metal foil are etched using an etching solution. For example, using such a method, the shape illustrated in FIG. 2B is obtained.

In the example illustrated in FIG. 2C, the top surface (T) of the pad (12a) is curved. The top surface (T) of the pad (12a) is curved such that the thickness of the pad (12a) generally increases from the side wall of the pad (12a) toward the conductive pillar 17. The exposed surface of the conductor layer (17a) is curved such that the thickness of the conductor layer (17a) generally increases from the outer periphery of the lower surface (17U) of the conductive pillar 17 toward the center of the lower surface (17U). The conductive pillar 17 is used as a mask, and a top surface (T) portion of the pad (12a) and the metal foil are removed by etching by injecting an etching solution. The supply of the etching solution is interfered by the resin insulating layer 11 and the conductive pillar 17. For example, using such a method, the shape illustrated in FIG. 2C is obtained. Since the top surface (T) is curved, the pad (12a) is unlikely to deteriorate during heat cycles. The conductive pillar 17 is unlikely to be deteriorated by heat cycles. The connection reliability between the electrode 21 and the electronic component is high.

Figure 7A:
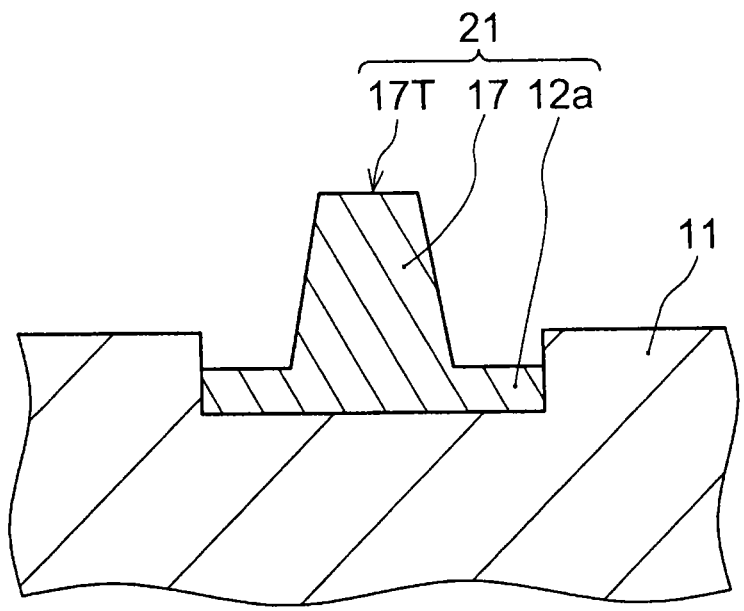
FIG. 7A illustrates another example of a conductive pillar.

FIG. 7A illustrates an example of a shape of the conductive pillar 17. In FIG. 7A, the conductive pillar 17 is gradually increased in diameter from the upper surface of the conductive pillar 17 toward the pad (12a). The side wall of the conductive pillar 17 tapers from the pad (12a) toward the upper surface (17T) of the conductive pillar 17. The metal film gradually increases in diameter from the upper surface (17T) of the conductive pillar 17 toward the pad (12a). The side wall of the metal film tapers from the pad (12a) toward the upper surface of the conductive pillar 17. Therefore, the conductive pillar 17 is unlikely to deteriorate. Resistance of the conductive pillar 17 is not increased by heat cycles.

Figure 7B:
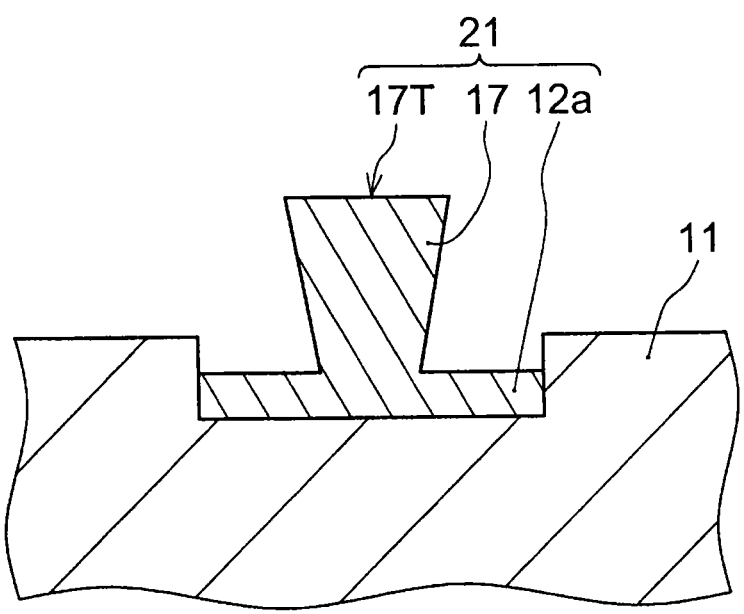
FIG. 7B illustrates another example of a conductive pillar.

FIG. 7B illustrates an example of a shape of the conductive pillar 17. In FIG. 7B, the conductive pillar 17 is gradually decreased in diameter from the upper surface (17T) of the conductive pillar 17 toward the pad (12a). The side wall of the conductive pillar 17 tapers from the upper surface (17T) of the conductive pillar 17 toward the pad (12a). The metal film gradually decreases in diameter from the upper surface (17T) of the conductive pillar 17 toward the pad (12a). The side wall of the metal film tapers from the upper surface (17T) of the conductive pillar 17 toward the pad (12a). Therefore, the conductive pillar 17 is easily deformed. A stress is relaxed by the conductive pillar 17. The connection resistance between the printed wiring board and the electronic component is not increased by heat cycles.

The electrode 21 of the printed wiring board 1 in each of FIGS. 2A, 2B and 2C has an interface between the metal film (17c) and the metal layer (17b). The electrode 21 has an interface between the metal layer (17b) and the conductor layer (17a). The electrode 21 has a virtual interface between the conductor layer (17a) and the pad (12a). Among these interfaces, when the conductive pillar 17 is subjected to a force, a stress is likely to concentrate in the virtual interface between the conductive pillar 17 and the pad (12a). The stress is likely to concentrate on the intersection point between the side surface of the conductive pillar 17 and the top surface (T) of the pad (12a). The stress occurs, for example, due to a difference in thermal expansion coefficient between the electronic component and the printed wiring board 1. The intersection point between the side wall of the conductive pillar 17 and the upper surface (T) of the pad (12a) is a bending point. Therefore, a crack is likely to occur from the bending point. However, according to the printed wiring board 1, the conductive pillar 17 and the pad (12a) are continuously formed. For example, the conductive pillar 17 and the pad (12a) are continuously formed of the material that forms the first conductor layer 12. Therefore, for the electrode 21 in any shape, peeling or a crack is unlikely to occur in the electrode 21.

A method for manufacturing the printed wiring board illustrated in FIG. 1 according to an embodiment of the present invention is described with reference to FIG. 3A-3I.

Figure 3A:
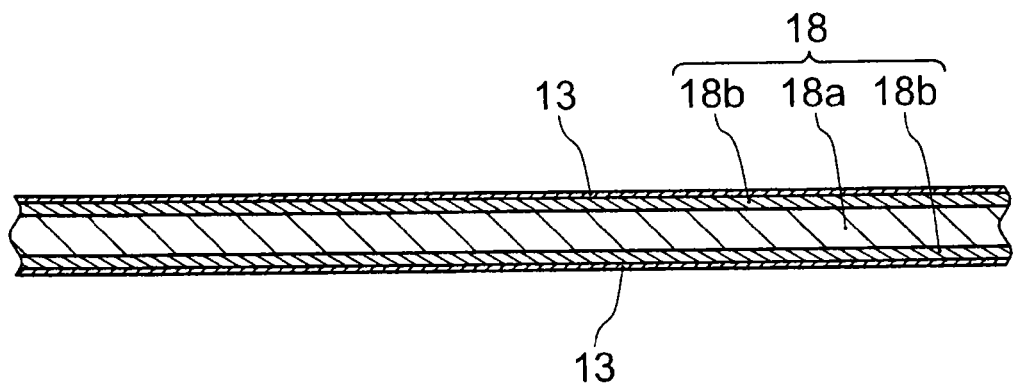
FIG. 3A illustrates a method for manufacturing the printed wiring board illustrated in FIG. 1.

As illustrated in FIG. 3A, a support plate 18 is prepared. Examples of the support plate 18 include a metal plate and a copper-clad laminated plate. In FIG. 3A, as the support plate 18, a double-sided copper-clad laminated plate is used. The metal foil 13 is laminated on both sides of the double-sided copper-clad laminated plate 18. The metal foil 13 has a first surface and a second surface that is on an opposite side of the first surface. The first surface of the metal foil 13 is exposed. For example, the metal foil 13 has a thickness of 2-7 μm. A preferred thickness is 5 μm. An insulating substrate (18a) of the double-sided copper-clad laminated plate 18 has a thickness of 100 μm, and a copper foil (18b) of the double-sided copper-clad laminated plate 18 has a thickness of 18 μm. REVALPHA (not illustrated in the drawings) (manufactured by Nitto Denko Corporation) is formed between the double-sided copper-clad laminated plate 18 and the metal foil 13, and the double-sided copper-clad laminated plate 18 and the metal foil 13 are bonded by the REVALPHA. An adhesive force of the REVALPHA decreases when the REVALPHA is heated.

Figure 3B:
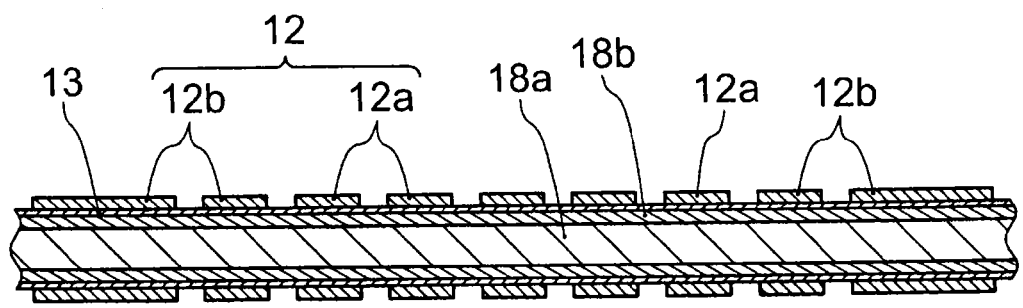
FIG. 3B illustrates the method for manufacturing the printed wiring board illustrated in FIG. 1.

A plating resist (not illustrated in the drawings) is formed on the first surface of the metal foil 13. The metal foil 13 is used as a seed layer, and the first conductor layer 12 is formed using an electrolytic copper plating method on the metal foil 13 that is exposed from the plating resist. Thereafter, the plating resist is removed. As illustrated in FIG. 3B, the first conductor layer 12 is formed of copper on the metal foil 13.

Figure 3C:
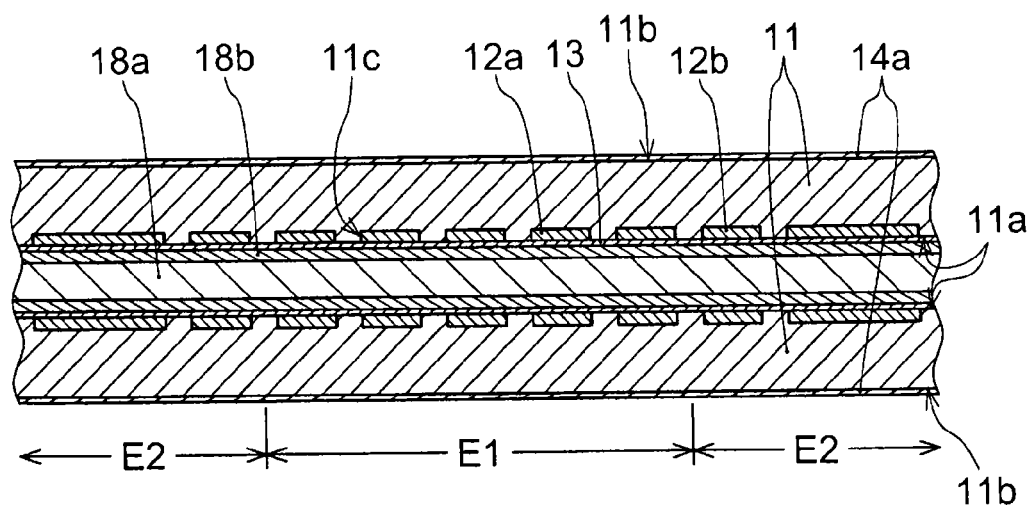
FIG. 3C illustrates the method for manufacturing the printed wiring board illustrated in FIG. 1.

As illustrated in FIG. 3C, a resin film for the resin insulating layer 11 and a second metal foil (14a) are laminated on the first surface of the metal foil 13 and on the first conductor layer 12. The resin film has a first surface and a second surface that is on an opposite side of the first surface. The resin film is laminated such that the first surface of the resin film opposes the first surface of the metal foil 13. The second metal foil (14a) is laminated on the second surface of the resin film. Thereafter, hot pressing is performed. The resin film is cured, and the resin insulating layer 11 is formed from the resin film. The first conductor layer 12 is embedded on the first surface side of the resin film. As a result, the recess (11c) for the first conductor layer 12 is formed on the first surface (11a) side of the resin insulating layer 11. The resin insulating layer 11 has the recess (11c) for the first conductor layer 12 on the first surface (11a) side. The first conductor layer 12 is formed in the recess (11c). The second metal foil (14a) is bonded to the second surface (11b) of the resin insulating layer 11.

The first conductor layer 12 has multiple pads (12a) in a central area (E1) of the resin insulating layer 11 for mounting an electronic component and a wiring (12b) in an outer peripheral area (E2). As illustrated in FIG. 5, the outer peripheral area (E2) is covered by the upper side solder resist layer 16, and the central area (E1) is exposed by the opening part (16a) of the upper side solder resist layer 16. The resin insulating layer 11 is formed of inorganic particles such as silica particles and a resin such epoxy. The resin insulating layer 11 may further contain a reinforcing material such as a glass cloth. The resin insulating layer of FIG. 3C is formed of inorganic particles, a reinforcing material and a resin.

Figure 3D:
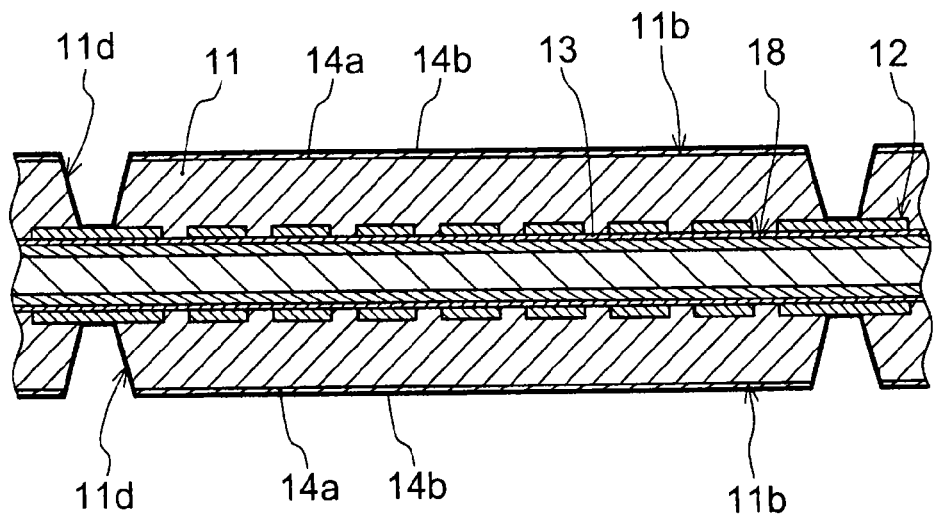
FIG. 3D illustrates the method for manufacturing the printed wiring board illustrated in FIG. 1.

As illustrated in FIG. 3D, laser is irradiated to the second metal foil (14a). An opening (11d) is formed that penetrates the second metal foil (14a) and the resin insulating layer 11 and reaches the first conductor layer. A seed layer (14b) is formed on an inner wall of the opening (11d) and on the second metal foil (14a) by electroless plating or the like.

Figure 3E:
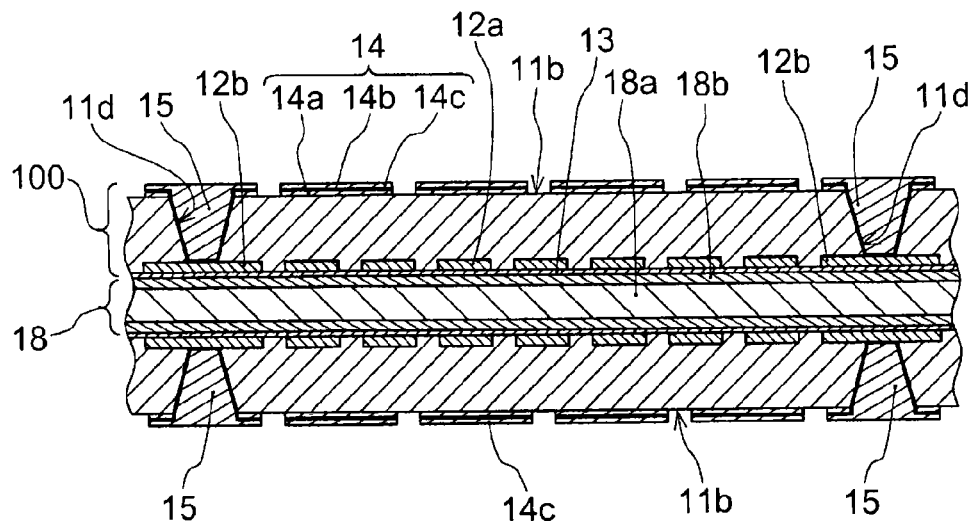
FIG. 3E illustrates the method for manufacturing the printed wiring board illustrated in FIG. 1.

An electrolytic plating film (14c) is formed on the seed layer (14b) by electrolytic plating. In this case, the electrolytic plating film (14c) is formed on the second surface (11b) and in the opening (11d). An etching resist is formed on the electrolytic plating film (14c). The electrolytic plating film (14c), the seed layer (14b) and the second metal foil (14a) that are exposed from the etching resist are removed. As illustrated in FIG. 3E, on the second surface (11b), the second conductor layer 14 is formed that includes the second metal foil (14a), the seed layer (14b) on the second metal foil (14a), and the electrolytic plating film (14c) on the seed layer (14b). The via conductor 15 that connects the first conductor layer 12 and the second conductor layer 14 is formed in the opening (11d). On the support plate 18, an intermediate substrate 100 is completed. The intermediate substrate 100 is formed by the metal foil 13, the first conductor layer 12, the resin insulating layer 11, the second conductor layer 14 and the via conductor 15.

Figure 3F:
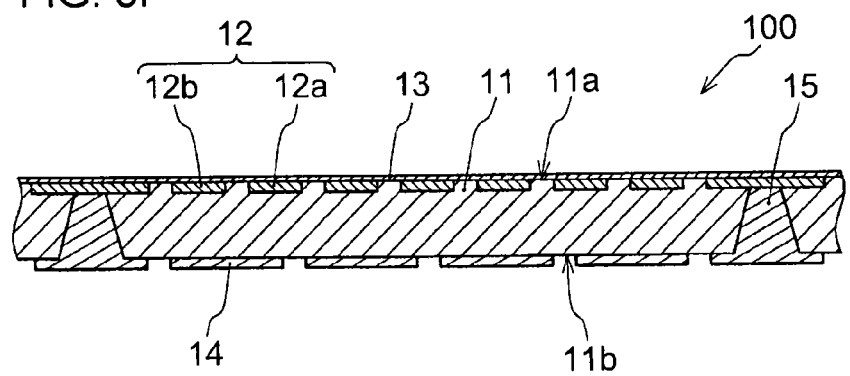
FIG. 3F illustrates the method for manufacturing the printed wiring board illustrated in FIG. 1.

As illustrated in FIG. 3F, the metal foil 13 and the support plate 18 are separated by heat. The intermediate substrate 100 is obtained. The first surface of the metal foil 13 of the intermediate substrate 100 is exposed.

Figure 3G:
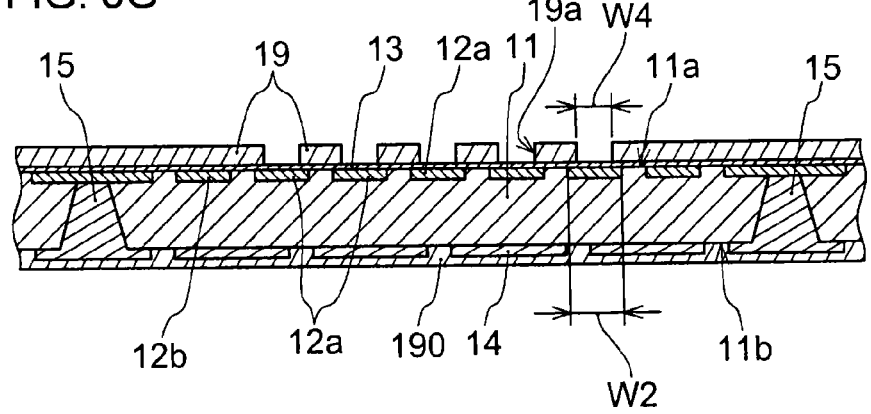
FIG. 3G illustrates the method for manufacturing the printed wiring board illustrated in FIG. 1.
Figure 3H:
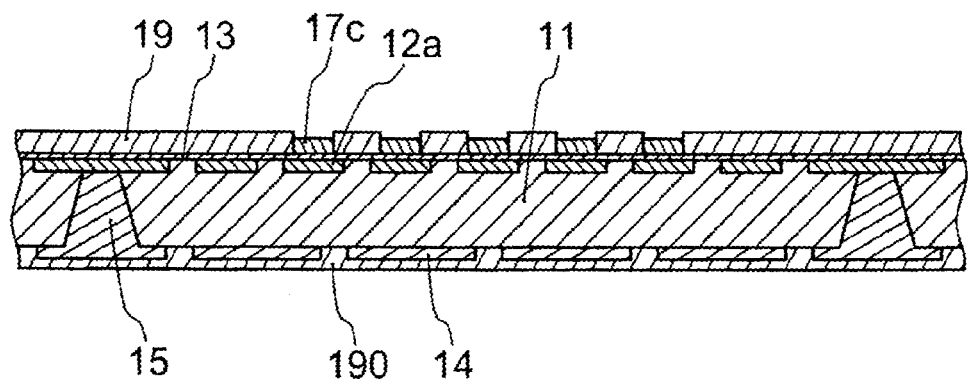
FIG. 3H illustrates the method for manufacturing the printed wiring board illustrated in FIG. 1.

Next, as illustrated in FIG. 3G, a plating resist 19 having an opening (19a) is formed on the metal foil 13. The opening (19a) exposes the metal foil 13 on the pad (12a). As illustrated in FIG. 3G, a diameter (W4) of the opening (19a) is smaller than the diameter (W2) of the pad (12a). The diameter (W4) is substantially equal to the diameter (W1) of the conductive pillar 17. The metal foil 13 on an outer periphery of the pad (12a) is covered by the plating resist 19. The metal foil 13 on a central portion of the pad (12a) is not covered by the plating resist 19. In FIG. 3G, the diameter (W2) is 35 μm, and the diameter (W4) is 20 μm. The plating resist 19 has a thickness of about 20 μm. The metal film (17c) is formed on the metal foil 13 that is exposed from the opening (19a). The metal foil 13 is used as a seed layer, and the metal film (17c) is formed by electrolytic plating. In FIG. 3H, the metal film (17c) is an electrolytic copper plating film that is formed by electrolytic copper plating. In this case, a protective film 190 is formed on the second surface (11b) of the resin insulating layer and on the second conductor layer 14.

Figure 3I:
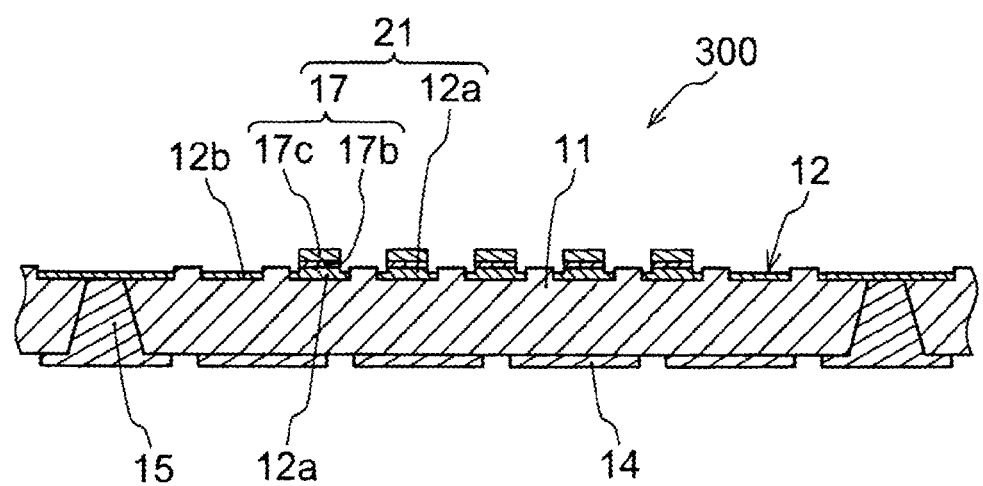
FIG. 3I illustrates the method for manufacturing the printed wiring board illustrated in FIG. 1.

The plating resist 19 is removed. By removing the plating resist 19, the metal foil 13 is exposed. The metal film (17c) is used as a mask, and the metal foil 13 is removed. The first surface (11a) of the resin insulating layer 11 and the top surface (T) of the pad (12a) are exposed. The top surface (T) of the first conductor layer 12 other than the pad (12a) is exposed. When the metal foil 13 is removed by etching, in order to prevent short circuiting between adjacent pads (12a), an upper surface portion of the pad (12a) that is exposed by removing the metal foil 13 is removed. The removed upper surface portion of the pad has a thickness of greater than 0 and equal to or less than 5 μm. In order to reduce a risk of short circuiting, it is preferable that the removed portion have a thickness of 1 μm or more. The first conductor layer 12 including the pad (12a) is formed. The top surface (T) of the first conductor layer 12 is recessed from the first surface (11a). The electrode 21 that includes the pad (12a) and the conductive pillar 17 is completed. The protective film 190 is removed. A circuit substrate 300 illustrated in FIG. 3I is completed.

As illustrated in FIG. 1, the solder resist layers (16, 160) are respectively formed on both surfaces (11a, 11b) of the resin insulating layer 11. The upper side solder resist layer 16 covers the outer peripheral area (E2) (see FIGS. 3C and 5) and has the one opening part (16a) that exposes the central area (E1). The upper side solder resist layer 16 has only the opening part (16a). Electrodes 21 are exposed by the opening part (16a). A modified embodiment of the upper side solder resist layer 16 is described below. It is also possible that the upper side solder resist layer 16 has the one opening part (16a) that exposes all of the electrodes 21 and has opening parts that respectively individually expose outer peripheral pads that are formed in the outer peripheral area (E2). The outer peripheral pads are included in the first conductor layer 12, and are connected to an electronic component or a circuit substrate. The opening parts that expose the outer peripheral pads are not illustrated in the drawings. The lower side solder resist layer 160 covers the entire second surface (11b) of the resin insulating layer 11, and has the opening parts (160a) that respectively expose the lower side pads (160P)

When the metal foil 13 is removed using an etching solution, a surface portion of the metal film (17c) is also removed. When an upper surface portion of the pad (12a) is removed using an etching solution, a surface portion of the metal film (17c) and a side wall portion of the metal layer (17b) are also removed. When the etching speed of the metal film (17c) is faster than the etching speed of the metal layer (17b), the conductive pillar 17 of FIG. 6B is obtained. When the etching speed of the metal layer (17b) is faster than the etching speed of the metal film (17c), the conductive pillar of FIG. 6A is obtained. By selecting an etching solution and materials for the metal film (17c) and the metal layer (17b), the shape illustrated in FIG. 6A or FIG. 6B is obtained.

A printed wiring board having the conductive pillar 17 illustrated in FIG. 4 is immersed in an etching solution from the upper surface (17T) of the conductive pillar 17. The etching solution flows toward the side wall of the conductive pillar 17. An etching amount of the side surface of the conductive pillar 17 increases from the lower surface (17U) toward the upper surface (17T). Therefore, the side wall of the conductive pillar 17 has the shape illustrated in FIG. 7A.

A printed wiring board having the conductive pillar 17 illustrated in FIG. 4 is immersed in an etching solution from the second surface (11b) of the resin insulating layer 11. The upper surface (17T) of the conductive pillar 17 enters the etching solution last. The etching solution flows toward the side wall of the conductive pillar 17. An etching amount of the side surface of the conductive pillar 17 increases from the upper surface (17T) toward the lower surface (17U). Therefore, the side wall of the conductive pillar 17 has the shape illustrated in FIG. 7B.

A protective film can be formed on the surface of the electrode 21. The protective film is a film for preventing oxidation of the electrode. Examples of the protective film include OSP, Ni/Au, Ni/Pd/Au and Sn films. The protective film is not illustrated in the drawings.

A method for manufacturing the conductive pillar 17 illustrated in FIG. 4 is described below. In the electrode 21 of FIG. 4, the pad (12a) and the conductive pillar 17 are simultaneously formed and are integrated. A nickel foil with thickness of 200 μm is prepared. A non-through hole is formed in the nickel foil. The non-through hole has a shape of circular cylinder, a diameter of 20 μm, and a depth of 20 μm. A plating resist is formed on the nickel foil. The plating resist has an opening that exposes the non-through hole and the nickel foil around the non-through hole. An electrolytic copper plating film is formed in the non-through hole and in the opening of the plating resist. The plating resist is removed. A first conductor layer including the pad (12a) is formed on the nickel foil. The conductive pillar 17 is formed in the non-through hole of the nickel foil. The resin insulating layer 11 is formed on the nickel foil that is exposed from the first conductor layer and on the first conductor layer. The first surface (11a) of the resin insulating layer 11 opposes the nickel foil. A second conductor layer (not illustrated in the drawings) is formed on the second surface (11b) of the resin insulating layer 11 using a semi-additive method. A via conductor (not illustrated in the drawings) that penetrates the resin insulating layer 11 and connects the first conductor layer and the second conductor layer is formed. The nickel foil is selectively removed by etching. An upper surface portion of the first conductor layer that is exposed from the conductive pillar 17 is removed by etching. The top surface (T) of the pad (12a) is recessed from the first surface (11a). The lower side solder resist layer 160 having an opening part (not illustrated in the drawings) that exposes a lower side pad is formed on the second surface (11b) of the resin insulating layer 11 and on the second conductor layer. An upper side solder resist layer is not formed on the first surface (11a) of the resin insulating layer and on the first conductor layer. In FIG. 4, the solder resist layer 160 is formed only on the second surface (11b) of the resin insulating layer. It is also possible that the printed wiring board of FIG. 1 does not have the upper side solder resist layer 16, and has only the lower side solder resist layer 160.

Resin insulating layers and conductor layers can be alternately laminated on the resin insulating layer 11 and the second conductor layer 14.

Figure 8:
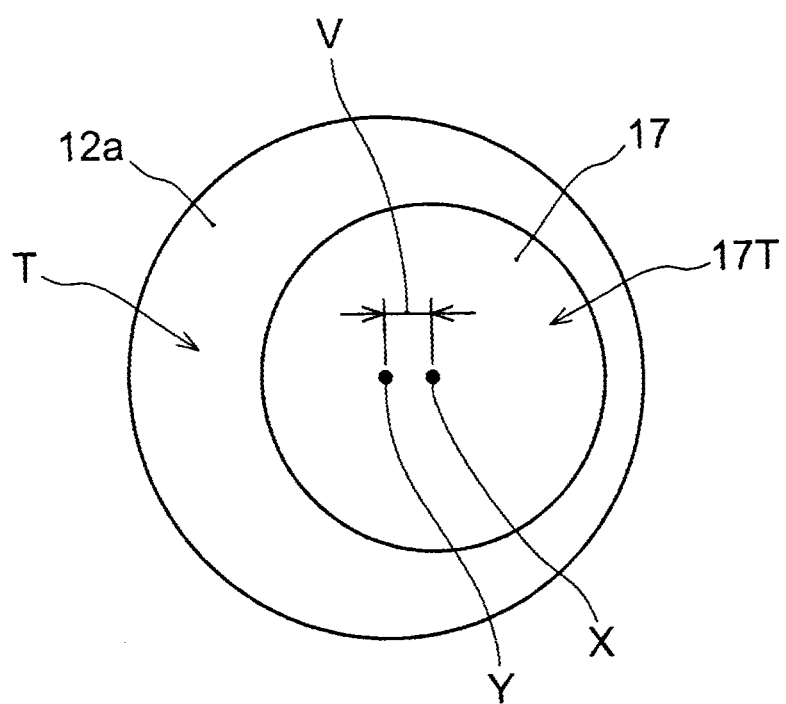
FIG. 8 illustrates positions of a pad and a conductive pillar.

A straight line, which passes through a centroid of the upper surface (17T) of the conductive pillar 17 and is perpendicular to the first surface (11a), and the bottom surface (B) of the pad (12a) intersect at an intersection point (X). The bottom surface (B) has a centroid (Y). It is preferable that the intersection point (X) and the centroid (Y) do not coincide. That is, as illustrated in FIG. 8, the conductive pillar 17 is not formed substantially at the center of the pad (12a). FIG. 8 is a view obtained by observing the conductive pillar 17 and the pad (12a) from the top of the conductive pillar 17. Since the intersection point (X) and the centroid (Y) do not overlap each other, even when the conductive pillar 17 is subjected to a stress, the electrode 21 is not peeled off from the resin insulating layer. A distance (V) between the intersection point (X) and the centroid (Y) is 5 μm or less. Even when the conductive pillar 17 is subjected to a force, the connection reliability between the conductive pillar 17 and the pad (12a) is high. It is preferable that the distance (V) be 2 μm or more. When the positional displacement is large, the size of the pad is increased. Since the printed wiring board is increased in size, a stress acting on the conductive pillar 17 is increased.

According to the manufacturing method of the present embodiment, a metal foil is effectively utilized. Manufacturing cost can be reduced.

A semiconductor element may be mounted on a lower-layer wiring of a circuit substrate. The lower-layer wiring may be recessed from an insulating layer. Therefore, a distance between the semiconductor element and the lower-layer wiring may be long, making it more difficult to mount the semiconductor element on the circuit substrate. Further, in a semiconductor package, a distance between the semiconductor element and the circuit substrate may be short, making it difficult to fill an underfill between the circuit substrate and the semiconductor element. Connection reliability between such a circuit substrate and the semiconductor element is expected to be low.

A printed wiring board according to an embodiment of the present invention includes: a resin insulating layer that has a first surface and a second surface that is on an opposite side of the first surface and has recesses that are formed on the first surface side; a first conductor layer that is formed in the recesses and includes pads; conductive pillars that are formed on the pads for mounting an electronic component; a second conductor layer that is formed on the second surface of the resin insulating layer; and a via conductor that penetrates the resin insulating layer and connects the first conductor layer and the second conductor layer. The pad has a back surface that opposes a bottom surface of the recess and has a top surface that is on an opposite side of the back surface. The top surface that is exposed from the conductive pillar is recessed from the first surface.

In a printed wiring board according to an embodiment of the present invention, yield in mounting an electronic component such as a semiconductor element is increased.

In a printed wiring board according to an embodiment of the present invention, connection reliability between an electronic component and the printed wiring board is increased.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a resin insulating layer having a plurality of recess portions formed on a first surface of the resin insulating layer,
   a first conductor layer formed in the recess portions and comprising a plurality of pads positioned to mount an electronic component onto the resin insulating layer;
   a plurality of conductive pillars formed on the plurality of pads, respectively, and configured to mount the electronic component onto the resin insulating layer;
   a second conductor layer formed on a second surface of the resin insulating layer on an opposite side with respect to the first surface; and
   a via conductor formed in the resin insulating layer such that the via conductor is penetrating through the resin insulating layer and is connecting the first conductor layer and the second conductor layer,
   wherein the plurality of conductive pillars is formed such that each of the pads has an exposed surface exposed from a respective one of the conductive pillars, the plurality of pads is formed such that the exposed surface is recessed from the first surface of the resin insulating layer, and each of the pads has a center portion and a peripheral portion such that a respective one of the conductive pillars is formed on the center portion, that the center portion is not exposed and is thicker than the peripheral portion and that the peripheral portion has the exposed surface recessed from the first surface of the resin insulating layer and a thickness which is increasing gradually toward the center portion.

2. A printed wiring board according to claim 1, wherein each of the conductive pillars comprises a metal layer formed on a surface of a respective one of the pads, and a metal film formed on a surface of the metal layer.

3. A printed wiring board according to claim 2, wherein the metal layer comprises a copper foil, and the metal film comprises a plating film.

4. A printed wiring board according to claim 3, wherein the metal layer is formed such that the metal layer has a surface facing the respective one of the pads and positioned on a plane of the first surface of the resin insulating layer.

5. A printed wiring board according to claim 3, wherein the metal layer is formed such that the metal layer has a side wall which is recessed from a side wall of the metal film.

6. A printed wiring board according to claim 3, wherein the plurality of pads is formed such that each of the pads has a pillar portion forming a portion of the respective one of the conductive pillars.

7. A printed wiring board according to claim 3, wherein each of the pads has the center portion and the peripheral portion such that the peripheral portion has a curved surface and the thickness which is gradually increasing toward the center portion.

8. A printed wiring board according to claim 3, wherein the plurality of pads is formed such that the exposed surface is inclined with respect to the first surface of the resin insulating layer.

9. A printed wiring board according to claim 2, wherein the metal layer is formed such that the metal layer has a surface facing the respective one of the pads and positioned on a plane of the first surface of the resin insulating layer.

10. A printed wiring board according to claim 2, wherein the metal layer is formed such that the metal layer has a side wall which is recessed from a side wall of the metal film.

11. A printed wiring board according to claim 2, wherein the plurality of pads is formed such that each of the pads has a pillar portion forming a portion of the respective one of the conductive pillars.

12. A printed wiring board according to claim 2, wherein each of the pads has the center portion and the peripheral portion such that the peripheral portion has a curved surface and the thickness which is gradually increasing toward the center portion.

13. A printed wiring board according to claim 2, wherein the plurality of pads is formed such that the exposed surface is inclined with respect to the first surface of the resin insulating layer.

14. A printed wiring board according to claim 1, wherein each of the pads has the center portion and the peripheral portion such that the peripheral portion has a curved surface and the thickness which is gradually increasing toward the center portion.

15. A printed wiring board according to claim 6, wherein the metal layer is formed such that the metal layer has a surface facing the respective one of the pads and positioned on a plane of the first surface of the resin insulating layer.

16. A printed wiring board according to claim 6, wherein the metal layer is formed such that the metal layer has a side wall which is recessed from a side wall of the metal film.

17. A printed wiring board according to claim 14, wherein the plurality of pads is formed such that each of the pads has a pillar portion forming a portion of the respective one of the conductive pillars.

18. A printed wiring board according to claim 1, wherein the plurality of pads is formed such that the exposed surface is inclined with respect to the first surface of the resin insulating layer.

19. A printed wiring board according to claim 1, wherein the resin insulating layer has an opening portion formed such that the plurality of pads is formed inside the opening portion of the resin insulating layer.

20. A printed wiring board according to claim 1, wherein the plurality of pads is formed such that each of the pads has a pillar portion forming a portion of the respective one of the conductive pillars.

* * * * *